US006998636B2

(12) United States Patent
Venkatraman et al.

(10) Patent No.: US 6,998,636 B2
(45) Date of Patent: Feb. 14, 2006

(54) MATERIALS HAVING LOW DIELECTRIC CONSTANTS AND METHOD OF MAKING

(75) Inventors: Chandra Venkatraman, Williamsville, NY (US); Cyndi L. Ackerman, Depew, NY (US)

(73) Assignee: N.V. Bekaert S.A, (BE)

( * ) Notice: Subject to any disclaimer, the term of this patent is extended or adjusted under 35 U.S.C. 154(b) by 348 days.

(21) Appl. No.: 10/239,493

(22) PCT Filed: Mar. 20, 2001

(86) PCT No.: PCT/US01/08840

§ 371 (c)(1),
(2), (4) Date: Jan. 21, 2003

(87) PCT Pub. No.: WO01/71776

PCT Pub. Date: Sep. 27, 2001

(65) Prior Publication Data

US 2003/0141499 A1   Jul. 31, 2003

Related U.S. Application Data

(60) Provisional application No. 60/190,651, filed on Mar. 20, 2000.

(51) Int. Cl.
*H01L 35/24* (2006.01)
(52) U.S. Cl. .................. 257/40; 257/10; 438/787; 438/788

(58) Field of Classification Search ............... 257/40, 257/632, 635, 10; 438/624, 763, 788
See application file for complete search history.

(56) References Cited

U.S. PATENT DOCUMENTS

| | | | |
|---|---|---|---|
| 5,302,420 A * | 4/1994 | Nguyen et al. | 427/490 |
| 5,352,493 A | 10/1994 | Dorfman | |
| 5,466,431 A | 11/1995 | Dorfman | |
| 5,638,251 A | 6/1997 | Goel | |
| 5,718,976 A | 2/1998 | Dorfman | |
| 5,728,465 A | 3/1998 | Dorfman | |
| 5,786,068 A | 7/1998 | Dorfman | |
| 5,795,648 A | 8/1998 | Goel | |
| 6,013,980 A | 1/2000 | Goel | |
| 6,068,884 A * | 5/2000 | Rose et al. | 438/762 |
| 6,083,313 A | 7/2000 | Venkatraman | |
| 6,383,955 B1 * | 5/2002 | Matsuki et al. | 438/790 |

* cited by examiner

*Primary Examiner*—David Nelms
*Assistant Examiner*—Dao H. Nguyen
(74) *Attorney, Agent, or Firm*—Rogalskyj & Weyand, LLP

(57) ABSTRACT

The invention relates to a material including carbon, oxygen, silicon and hydrogen and having a dielectric constant of from about 2.1 to about 3.0 where an FTIR scan of the material includes at least two major peaks signifying Si—$CH_3$ bonding. The invention further relates to a material which has a variable dielectric constant through the thickness of the material. Another aspect of the invention is the method of making the material.

22 Claims, 4 Drawing Sheets

| STRUCTURE | RESONANCE MODE | POSITION (WAVE NUMBERS) |
|---|---|---|
| Si-O-Si RING | Si-O STRETCH | 1060-1080 |
| Si-O-Si CHAIN | Si-O STRETCH; C-O STRETCH | 1020-1080 |
| Si-O | | 800-810 |
| | | |
| Si-(CH3)3 | Si-C DEFORMATION | 1260 |
| Si-(CH3)3 | Si-C STRETCH | 840 |
| Si-(CH3)2 | Si-C DEFORMATION | 1250 |
| Si-(CH3)2 | Si-C STRETCH | 802 AND 888 |
| Si-CH3 | C-H VIBRATION | 1410 |
| -CH3 | C-H STRETCH | 2961 |
| C-H | STRETCH | 2800-3000 |
| Si-H | STRETCH | 2130, 2150-2250 |
| R3 Si-H; WHERE R=CH3-Si-O OR CH3-O | Si-H | 2165 |
| Si-OH OR SiH | | 900 |
| | | |
| Si-OH | BEND | 925-930 |
| -OH | | 3650, 3350 |
| | | |
| Si-CH2-CH2-Si | | 720 |
| Si-CH2-CH2-Si | BENDING | 1400 |
| Si-CH2-CH2-Si | DEFORMATION | 1410 |
| Si-CH2-Si | BENDING | 1200-1260; 1360; 1400 |
| -CH2- (ALKANE) | DEFORMATION | 1463, 2855, 2925 |
| C=O | STRETCH | 1720 |

*FIG. 2*

| WAVENUMBER | PROPOSED STRUCTURE |
|---|---|
| MAJOR PEAKS: | |
| 1026 | Si-O-Si CHAIN |
| 836 | Si(CH3)3 |
| 801 | Si-O OR Si(CH3)2 |
| 1267 | Si(CH3)3 |
| | |
| MINOR PEAKS: | |
| 1400-1410 | Si-CH2-CH2-Si |
| 2120 | Si-H |
| 2961 | -CH3 OR C-H |
| | |
| VERY MINOR OR MISSING PEAKS: | |
| 720 | Si-CH2-CH2-Si |
| 925-930 | Si-OH |
| 1200-1260 | Si-CH2-Si |
| 1360 | Si-CH2-Si |
| 1400 | Si-CH2-CH2-Si OR Si-CH2-Si |
| 1410 | Si-CH3; Si-CH2-CH2-Si |
| 1463, 2885, 2925 | -CH2- (ALKANE) |
| 1720 | C=O |
| 2165 | Si-H OR R3 Si-H, WHERE R=CH3-Si-O OR CH3-O |
| 3650, 3350 | -OH |

*FIG. 3*

MATERIALS HAVING LOW DIELECTRIC CONSTANTS AND METHOD OF MAKING

The present application claims priority of U.S. Provisional Patent Application Ser. No. 60/190,651, filed on Mar. 20, 2000, which is hereby incorporated by reference herein.

FIELD OF THE INVENTION

The subject invention is directed generally to materials having a low dielectric constant and to methods of making such materials.

BRIEF DESCRIPTION OF THE DRAWINGS

These and other features and advantages of this invention will be evident from the following detailed description of preferred embodiments when read in conjunction with the accompanying drawings in which:

FIG. 2 is a table illustrating FTIR peak ranges and their bonding assignments.

FIG. 3 is a table illustrating an interpretation of an FTIR scan of a material of the present invention.

DETAILED DESCRIPTION OF THE INVENTION

The present invention relates to a material including carbon, oxygen, silicon and hydrogen having a dielectric constant of from about 2.1 to about 3.0 wherein a FTIR scan of the material includes at least two major peaks signifying Si—$CH_3$ bonding.

The material includes carbon, silicon, oxygen and hydrogen. Argon and/or nitrogen may also be included, preferably in small quantities. The structure of the material is of randomly mixed organic and inorganic groups. The groups may be crosslinked. The groups may be present in a three dimensional matrix. Preferably, the material is formed having a backbone structure made substantially of inorganic Si—O—Si groups with organic side groups attached to the backbone. The Si—O—Si groups may be cyclic groups connected by inorganic chains to form a ring and chain structure. The inorganic chains may vary in length and composition. Organic side groups are attached to either, or both, the cyclic and chain groups. Alternatively, the material is made of a series of siloxane chains with organic side groups attached. The organic side groups are aliphatic, olefinic and aromatic hydrocarbons. Preferably, the organic side groups are made predominately of methyl groups.

In one embodiment of the material, the carbon content is from about 35 atomic percent of the material to about 80 atomic percent of the material, preferably from about 35 to about 70 atomic percent and more preferably from about 40 to about 60 atomic %. The silicon content of the material may range from about 10 up to about 50 atomic % of the material, with from about 15 to about 45% of the material being preferred and from about 20 to about 35 atomic % being especially preferred. The oxygen content may range from about 10 to about 45 atomic percent of the material, with from about 15 to about 25 atomic % being especially preferred. The hydrogen content of the material is at least 1 atomic % up to about 40 atomic %. Preferably, the ratio of silicon to carbon in the material is approximately 2:1.

The material of the present invention has a low dielectric constant. As used herein, "low dielectric constant" means a dielectric constant of less than 4.0 as measured using the Hg probe technique at 1 MHz. Preferably, the material of the present invention has a dielectric constant of less than 3.0, with from about 2.1 to about 2.8 being especially preferred and from about 2.1 to about 2.5 being most preferred. A dielectric constant of about 2.0 is generally referred to as an "ultra low dielectric constant".

The material is amorphous. As used herein, "amorphous" is defined as a random structure or arrangement of atoms in a solid state that results in no long range ordering, no crystallinity and/or no granularity.

Figure 1:
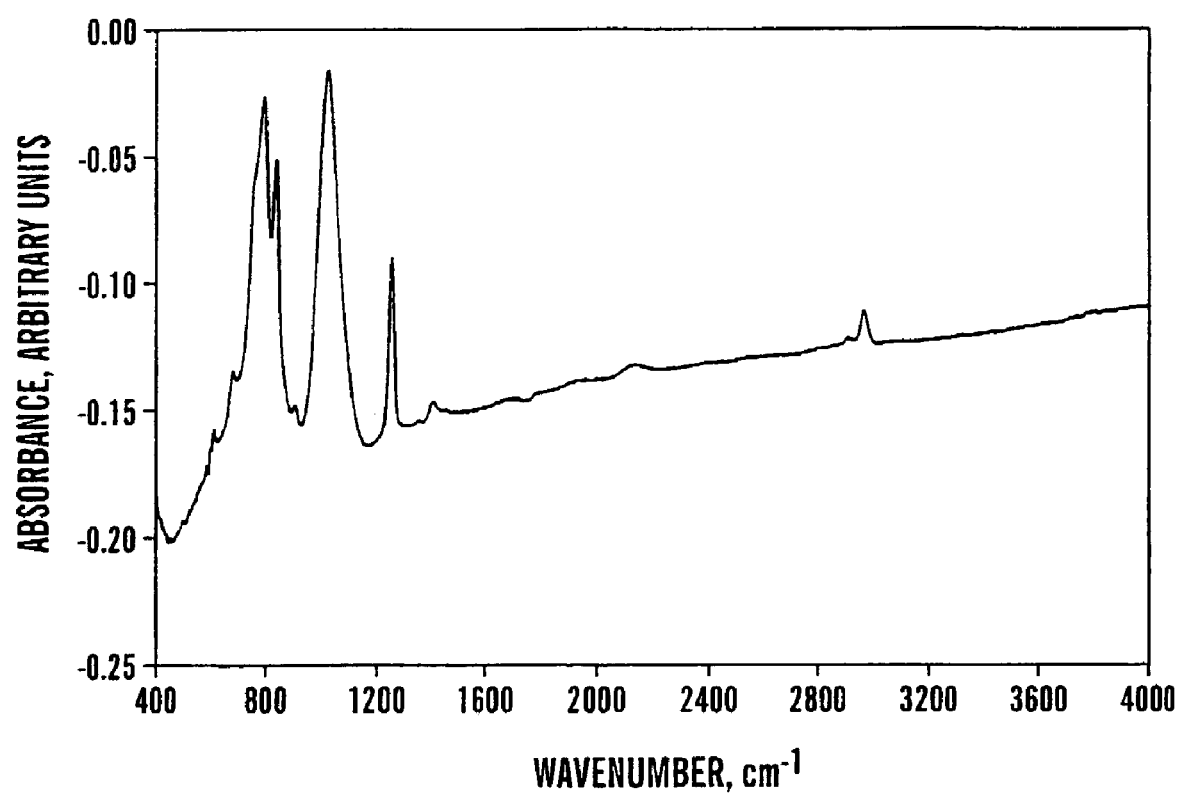
FIG. 1 illustrates a Fourtier transform infrared absorption ("FTIR") scan showing the composition of one embodiment of a material of the present invention.

As shown in FIG. 1, a Fourtier transform infrared absorption ("FTIR") scan of the material of the present invention indicates at least two major peaks. As used herein, a "major peak" is defined to mean any peak which has an intensity greater than about 25% of the intensity of the largest peak and a "minor peak" is defined to mean any peak which has an intensity less than about 25% of the intensity of the largest peak. As shown in FIG. 2, FTIR peak ranges and their corresponding bonding assignments have been identified (See U.S. Pat. No. 6,068,884, which is hereby incorporated by reference herein). The structure of the material of the present invention, as interpreted from the absorption peaks of FIG. 1 and their assignments shown in FIG. 2, is shown in the table of FIG. 3. As shown in FIGS. 1–3, the material of the present invention includes Si—O—Si chains, C—H bonds, Si—O bonds, Si—H bonds, Si—C bonds and Si—$CH_3$ bonds. The material includes predominantly type Si—$CH_3$ bonds. In the FTIR scan of the material of the present invention, there are a plurality of major peaks signifying Si—$CH_3$ bonding. One of the major peaks of the material of the present invention occurs at wavenumbers from about 835 to about 840 and a second major peak occurs at wavenumbers of from about 1250 to about 1270. As shown in FIG. 3, the major peaks in one embodiment of a material of the present invention occur at wavenumber 836 and at wavenumber 1267. As shown in FIGS. 2 and 3, these major peaks correspond to Si—$CH_3$ bonding. In particular, these major peaks correspond to Si—$(CH_3)_3$ bonding. More particularly, the major peak at wavenumber 1267 corresponds to a Si—C deformation resonance mode. The major peak at wavenumber 836 corresponds to a Si—C stretch resonance mode. There exists a correlation between the intensity of the Si—$CH_3$ peak and the dielectric constant of the coating. Typically, as the peak intensity increases, the dielectric constant decreases.

Although not meaning to be bound by theory, it is believed that the material of the present invention has inherently low density due to this bonding structure. On an atomic scale, micro sized pores are introduced into the coating by introducing Si—$CH_3$ functional end groups in a C—H and Si—O matrix material, resulting in the stretch bonding structure. Due to these micro pores, the material has a low density. The low dielectric constant of the material is attributed to this low density of the coating. Further, the presence of a large amount of Si—$CH_3$ bonding is directly related to the low dielectric constant.

Other chemical bonds which are present in one embodiment of the material include C—H at 2910 to 2970 wavenumbers, Si—H at 2120 wavenumbers, C=O at about 1720 wavenumbers, Si—O at about 1020 to about 1080 wavenumbers, Si—O at about 800 wavenumbers and Si—$CH_2$—$CH_2$—Si at about 1400–1410 wavenumbers.

Another aspect of the present invention is a material including carbon, oxygen, silicon and hydrogen having an upper surface and a lower surface and having a dielectric constant from about 2.1 to about 4.0, wherein the dielectric constant of the lower surface is from about 2.1 to about 2.7 and the dielectric constant of the upper surface is greater than 3.0.

In this aspect of the invention, the material of the present invention is produced such that the dielectric constant of the material is varied through the thickness of the material.

Another aspect of the present invention is the use of the material of the present invention in a semiconductor or integrated circuit. In this embodiment, the material of the present invention is used as the dielectric material in the semiconductor or integrated circuit. Semiconductors and integrated circuits are known in the art and are generally described in U.S. Pat. Nos. 6,180,511; 6,163,060; 6,200,849; and 6,174,780, which are each hereby incorporated by reference herein. In particular, the material of the present invention can be used as an intermetal dielectric material, as an etch stop, or as a copper barrier in integrated circuit manufacturing.

Yet another aspect of the present invention is a method of making a dielectric material which includes providing at least one organosilicon precursor and depositing the dielectric material on a substrate having a surface by chemical vapor deposition, where the precursor reacts and deposits the dielectric material on the surface of the substrate. The depositing occurs at a power density of from about 40 to less than 200 W/ft$^3$.

Deposition of the material of the present invention onto a substrate occurs by chemical vapor deposition and, more preferably, by plasma enhanced chemical vapor deposition.

Figure 4:
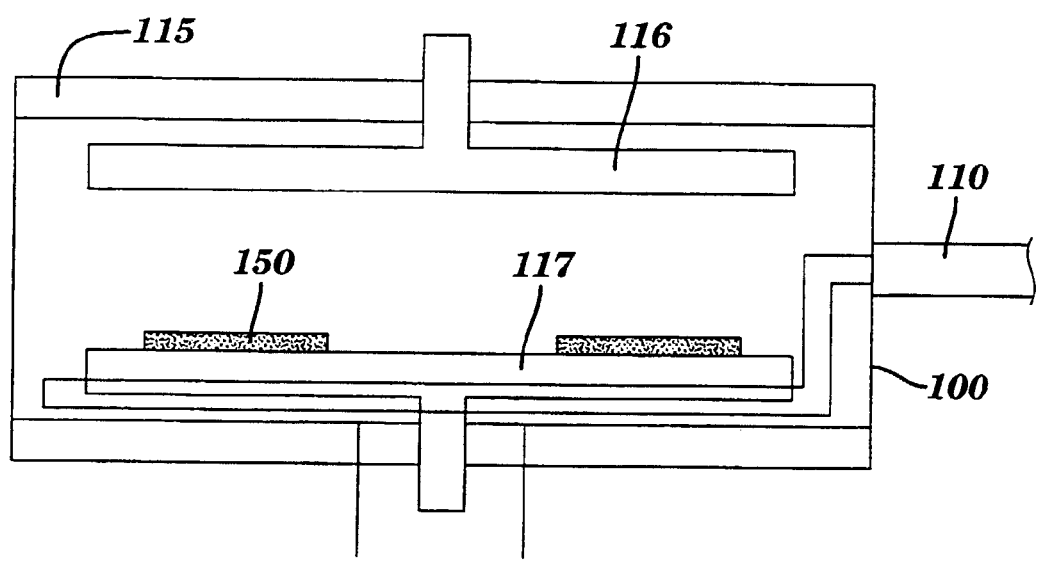
FIG. 4 illustrates an embodiment of a chamber used in the method of the present invention.

FIG. 4 shows one preferred embodiment of the chamber used for depositing the material of the present invention on a substrate to produce a coating. A vacuum deposition chamber 100 is provided to coat the substrates. A precursor inlet system 110 includes a metal tube and a gas distribution ring through which a precursor is injected. Precursor inlet system 110 is shown incorporated into chamber 100 through the sidewall of chamber 100. An alternate arrangement is the introduction of the precursor into chamber 100 from the top 115 of chamber 100 via a gas showerhead (not shown).

Substrates 150 to be coated are loaded into chamber 110 from top 115 of chamber 100 or through a load lock (not shown). Chamber 100 comprises a cylindrical enclosure with a top electrode 116 and a bottom electrode 117 which are in a parallel configuration. High and low frequency power supplies (not shown) are used for biasing either/or both electrodes. Typically, bottom electrode 117 is powered and top electrode 116 is grounded. Although substrates 150 are typically mounted on bottom electrode 117 which is powered, substrates 150 may be mounted on either top electrode 116 or bottom electrode 117 and either top or bottom electrodes 116, 117 may be grounded.

In use, valves (not shown) are closed and chamber 100 is backfilled with a gas, such as nitrogen or argon, until chamber 100 reaches atmospheric pressure. Top 115 of chamber 100 is opened and substrates 150 to be coated are placed on bottom electrode 117 or top electrode 116 using any fixtures or fastening means including clips, screws, clamps, or tape. Alternatively, substrate loading can be performed using cassette loading and robotic arms in a load-lock cluster tool system. Depending on the size of substrates 150, any number can be coated in chamber 100 at a time.

Next, high vacuum is achieved in chamber 100 by roughing down the chamber with a mechanical pump/roots blower pumping system. Other pumping systems, with or without traps, such as a diffusion pump, turbomolecular pump, cryogenic pump, or other high vacuum pumps known in the field of vacuum technology can also be used. The chamber is evacuated to a base pressure from below 1 to about 15 mTorr. Typically, low turbulence vacuum pumping is used to evacuate chamber 100 to minimize particulate matter and debris.

Prior to deposition of the coating, substrates 150 are cleaned inside chamber 100 using any type of ion cleaning, such as plasma cleaning. A cleaning gas is provided to chamber 100 via precursor inlet system 110. Substrate cleaning can be performed with a number of cleaning gases such as argon, oxygen or hydrogen. The choice of the most suitable cleaning gas during cleaning depends on the type of substrate. The cleaning gas flow rates and throttle valve are adjusted to obtain a chamber pressure in the 50 to 500 mTorr range. Preferably, substrate cleaning is performed by RF glow discharge. One or both of electrodes 116 and 117 are powered with a radio frequency ("RF") potential to excite a glow discharge. A RF frequency from about 100 KHz to about 100 MHz is used, with from about 1 Mhz to about 100 MHz being preferred. A power is used from about 50 to about 3000 W, with from about 500 to about 1500 W being preferred. The power density during cleaning ranges from about 40 to about 300. During the RF glow discharge, a substrate bias of from about 0.005 to about 2.0 kV is used. Typically, cleaning takes place for from about 1 minute to about 30 minutes with about 15 minutes being preferred. Other ion sources known in the field of deposition coating such as, Kaufmann type ion source, RF coil, or ECR sources can also be used for ion generation. The cleaning process efficiently removes hydrocarbon contamination, and other contaminants, as well as improve the adhesion of coatings deposited on substrates 150.

After the appropriate duration for cleaning, precursor is introduced into chamber 100 by liquid-to-vapor delivery system 110. The liquid-to-vapor delivery system is a conventional off-the shelf component known in the field of vacuum technology. The precursor is stored in a reservoir and is delivered to a flash evaporator. A mass flow controller is used to precisely control the flow rate of the precursor liquid through capillary tubing. The capillary tubing delivers the precursor to the evaporator where the precursor is flash evaporated into a vapor. In an alternate arrangement, the liquid precursor can be flash evaporated and then a mass flow controller used to precisely control the flow rate of the precursor vapor. While not required, a mixing gas, such as argon or helium, can be used to assist precursor delivery. Further, additional gases (reactive or inert) including, but not limited to, hydrogen, helium, oxygen, methane, acetylene, butane, and tetrafluoromethane, can be used for altering film properties.

Precursors are organosilicon compounds, preferably siloxanes which contain C, H, Si, and O. The precursors preferably have 1 to 10 silicon atoms. One preferred precursor is hexamethyldisiloxane ("HMDSO"). Other siloxanes and silanes, known in the state of the art, can be used as precursor material. Precursor flow rates of from about 30 to about 75 sccm are preferred. If used, carrier gas and/or additional gas flow rates of from about 30 to about 100 sccm are used.

Alternatively, sputtered silicon and oxygen gas are used as sources of Si and O; solid SiO$_2$ is used as a source for Si and O; SiH$_4$ and oxygen containing gases are used as sources for Si and O; or a graphite target, hydrogen, and hydrocarbon gases are used as sources of C and H. Combination of the these methods may be used.

The coating deposition preferably is sustained by a RF capacitively coupled discharge ("CCD"). During deposition, the precursor reacts and deposits on substrates 150. The RF CCD causes fragmentation and ionization of the precursor (and carrier and additional gases, if present). A pressure of from about 50 to about 600 mTorr is maintained in chamber 100 during the deposition stage. Preferably, the pressure is in the range of 50 to 500 mTorr. Either or both of electrodes 116 and 117 are powered by a RF frequency. The RF frequency applied to substrates 150 is in the range of from about 100 kHz to about 100 MHz, with from about 1 MHz to about 100 MHz being preferred. A power is used from about 50 W to about 3000 W, with from about 50 to about 1000 W being preferred. The power density is from about 40 to about 300 W/ft$^3$, with from about 40 to less than 200 w/ft$^3$ being preferred. The RF potential is about 0.005 to 2.0 kV.

Alternatively, during the deposition stage, the RF potential is applied in pulsed power mode. The frequency of the pulsing ranges from 0.05 to 4 Hz and the duty cycle ranges from 10 to 90%. The power can be pulsed on and off or varied from a higher to lower potential. The preferred mode is to vary the power from high to low power, because this method reduces powder formation in the plasma.

No external substrate heating is used. There is generation of heat due to ion bombardment, causing substrates 150 to heat to a temperature up to 70° C. The substrate holder can be actively cooled using a closed circuit heat exchanger, if desired.

In one embodiment of the invention, a dual electrode configuration is used in chamber 100. Electrode spacing is a parameter in controlling ion bombardment. Larger spacing reduces ion bombardment which, in turn, contributes to the growth of a low density, low dielectric constant coating. An electrode spacing between bottom electrode 117 and top electrode 116 greater than 1 cm is utilized, preferably greater than 5 cm and especially preferred is greater that 7 cm. Alternatively, a single plate configuration can be used.

In another embodiment of the chamber used in the method of the present invention, a large RF antenna can be placed inside chamber 100 to excite a discharge. The antenna can be made of copper, stainless steel, or other known state of the art materials. A protective coating, such as porcelain, can be applied to the surface of the antenna to prevent sputtering.

The coating process of the present invention can be carried out in a batch type process for small volumes. In such instance, substrates 150 are mounted on a substrate holder inside deposition chamber 100, chamber 100 is evacuated, the deposition is performed, and chamber 100 is vented, followed by the removal of the substrates 150 having a coating thereon. For larger volumes, the process of the present invention can be carried out with a load-lock cluster tool system. In such case, substrates 150 are mounted on cassettes and transported into chamber 100 using central robot handling and load-lock systems. A second cassette with its own load lock chamber can be used for removal of the substrates 150 having a coating thereon.

After deposition, the coated substrates can be annealed to further lower the dielectric constant of the coatings. Annealing must be performed in an inert gas environment, either at atmospheric pressure or under vacuum. The inert gas is typically argon or nitrogen. Additional gases, such as hydrogen, may be added to the inert carrier gases during annealing. Annealing times vary from 1 minute to 10 hours. The annealing temperature ranges from 100° C. to 500° C.

The coatings of the present invention have excellent adhesion, low film stress, high resistivity, low dielectric constant, good chemical resistance, a high degree of environmental stability, low surface energy and high water contact angle. The mechanical strength of the coating is dependent on the dielectric constant, but a hardcoat, such as diamond-like carbon ("DLC"), diamond like nanocomposites ("DLN") such as those described in U.S. Pat. No. 5,466,431 to Dorfman et al., which is hereby incorporated by reference, or $SiO_2$, can be used to improve the mechanical properties of the coating. Due to the lower stress of the coating, the coatings are flexible and, therefore, not prone to cracking.

The hardness of the coatings ranges from 0.01 to 3 GPa and the elastic modulus ranges from 1 to 50 GPa.

The coating thickness can range from 50 Å to 10 micrometers. The precursor flow rate and the RF power can be adjusted during deposition to control the deposition rate of the material on the substrate. Elevated precursor flowrates are preferred for the present invention. With high precursor flowrates, deposition rates as high as 0.26 µm/min can be achieved.

The coatings exhibit very low stress. The residual stress in the coatings has been characterized by laser beam deflection technique using the Stoney equations as known in the state of the art. The residual stress is compressive and is in the range of 50 to 400 MPa. The reason for low stress in the film is credited to the low temperature deposition process and the unique film structure.

The coatings have a resistivity exceeding $10^{+13}$ to $10^{+14}$ ohm-cm at room temperature. These coatings also yield a low leakage current density.

Good chemical compatibility and resistance to all chemicals utilized in integrated ("IC") fabrication is an essential property for an intermetal dielectric ("IMD") material. The coatings exhibit resistance to methanol, acetone, and IPA. In all cases, the coatings show no sign of discoloration, blistering, or loss of adhesion. The coatings also exhibit corrosion resistance and chemical inertness to acidic and alkaline materials.

The coatings of the present invention are very resistant to water absorption. Water absorption will lead to an increase in the dielectric constant. FTIR spectra of the deposited coatings, compared to a coating that was left exposed to ambient environment, indicate that the coatings have low moisture absorption.

Another critical requirement for an IMD material is thermal stability up to 450° C. The thermal stability of the coating of the present invention depends on the deposition process conditions. In some cases, annealing the coating will alter the coating chemistry, which can lead to either an increase or decrease in dielectric constant depending on the annealing conditions. However, the process conditions can be varied in such a way as to make the deposited coating thermally stable. In the preferred embodiment of the invention, the coating is deposited with a low dielectric constant and possesses good thermal stability; an optional annealing step can be used to lower the dielectric constant further.

The following examples serve only to further illustrate aspects of the present invention and should not be construed to limit the invention.

EXAMPLE 1

One full 100 mm low resistivity silicon wafer was mounted on the bottom (powered) electrode, the upper electrode was grounded. The electrode separation distance was 7.7 cm. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 400 mTorr. An RF power (13.56 MHz) of 300 Watts was used to bias the substrates for an in-situ plasma cleaning. The substrates were plasma cleaned for about 5 minutes. After cleaning, the substrate power was ramped down to 200 Watts, which corresponds to a bias of about 10 volts. The RF power was held constant throughout the deposition. Then the precursor was introduced through the liquid-to-vapor delivery system ("LDS"). Hexamethyldisiloxane ("HMDSO") was used as the precursor in this deposition. A precursor flow rate of 0.28 g/min was used. Argon was used as the carrier gas to assist in transport of precursor through the LDS and into the deposition chamber. The argon flow rate was 50 sccm. The deposition was performed under the above conditions for 60 minutes. This resulted in a 0.2 $\mu$m thick, highly adherent coating. The coating exhibited a hardness of 0.08 GPa and an elastic modulus of 3.5 GPa on silicon substrates as measured by nanoindentation using the Nanoindenter IIs manufactured by Nano Instruments (Oak Ridge, Tenn.). For capacitance measurements, aluminum metal was deposited on top of the dielectric coating. A shadow mask was used to deposit 2 mm, 3 mm, 5 mm and 7 mm diameter aluminum dots to serve as the upper electrode for the capacitance measurements. The capacitance of the coating, measured at 1 MHz, ranged from 300 pF to 800 pF, depending on the diameter of the electrode. This correlates to a film with a dielectric constant of 2.47 with a standard deviation of $\mp 0.1$.

EXAMPLE 2

A piece of the coated silicon substrate from Example 1 was annealed at atmospheric pressure in a nitrogen environment for 2 hours at 400° C. After the sample was annealed, aluminum electrodes, ranging in diameter from 2 mm to 7 mm, were deposited on the sample. The capacitance, measured at 1 MHz, ranged from 700 pF to 900 pF, which corresponds to a coating with a dielectric constant of 2.31 with a standard deviation of $\mp 0.05$. The hardness of the annealed coating was 0.1 to 0.33 GPa and the elastic modulus was 5.0 to 20.11 GPa. A comparison of the FTIR spectra of this annealed sample to the 'as deposited' sample described in Example 1, showed an increase in the intensity of the SiCH$_3$ absorption peak at wavenumber 1260.

EXAMPLE 3

One full 100 mm low resistivity silicon wafer was mounted on the bottom (powered) electrode, the upper electrode was grounded. The electrode separation distance was 7.7 cm. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 400 mTorr. An RF power (13.56 MHz) of 300 Watts was used to bias the substrates for an in-situ plasma cleaning. The substrates were plasma cleaned for about 5 minutes. After cleaning, the substrate power was ramped up to 500 Watts, which corresponds to a bias of about 30 volts. The RF power was held constant throughout the deposition. HMDSO was introduced through the LDS. A precursor flow rate of 0.28 g/min was used. Argon was used as the carrier gas to assist in transport of precursor through the LDS and into the deposition chamber. The argon flow rate was 50 sccm. The deposition was performed under the above conditions for 15 minutes. This resulted in a 0.5 $\mu$m thick, highly adherent coating. The coating exhibited a hardness of 0.05 GPa and an elastic modulus of 2.2 GPa on silicon substrates as measured by nanoindentation using the Nanoindenter IIs (Nano Instruments, Oak Ridge, Tenn.). For the capacitance measurements, aluminum metal was deposited on top of the dielectric coating. A shadow mask was used to deposit 2 mm, 3 mm, 5 mm and 7 mm diameter aluminum dots to serve as the upper electrode for the capacitance measurements. The capacitance of the coating, measured at 1 MHz, ranged from 130 pF to 1800 pF depending on the diameter of the electrode. This correlates to a film with a dielectric constant of 2.53 with a standard deviation of $\mp 0.08$.

EXAMPLE 4

One full 100 mm low resistivity silicon wafer was mounted on the bottom (powered) electrode. The electrode separation distance was 7.7 cm. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 450 mTorr. An RF power (13.56 MHz) of 300 Watts was used to bias the substrates for an in-situ plasma cleaning. The substrates were plasma cleaned for about 5 minutes. After cleaning, the substrate power was ramped down to 200 Watts, which corresponds to a bias of about 10 volts. The RF power was held constant throughout the deposition. HMDSO was introduced to the LDS. A precursor flow rate of 0.28 g/min was used. Argon was used as the carrier gas to assist in transport of precursor through the LDS and into the deposition chamber. The argon flow rate was 50 sccm. The deposition was performed under the above conditions for 180 minutes. This resulted in a 0.93 $\mu$m thick, highly adherent coating. The sample was annealed at atmospheric pressure in a nitrogen environment for 2 hours at 400° C. After the sample was annealed, aluminum electrodes, ranging in diameter from 2 mm to 7 mm, were deposited on the sample. The capacitance, measured at 1 MHz ranged from 162 pF to 1930 pF, which corresponds to a coating with a dielectric constant of 2.2 with a standard deviation of $\mp 0.02$. The hardness of the annealed coating was 0.04 GPa and the elastic modulus was 1.7 GPa.

EXAMPLE 5

Two full 100 mm silicon wafers, sputtered with about 1000 Å of titanium metal, were mounted on the bottom (powered) electrode, the upper electrode was grounded. The electrode separation distance was 7.7 cm. A portion of the titanium coated silicon substrate was shadow masked to allow electrical contact (to the lower titanium metal) for capacitance measurements. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 410 mTorr. An RF power (13.56 MHz) of 300 Watts was used to bias the substrates for an in-situ plasma cleaning. The substrates were plasma cleaned for about 5 minutes. After cleaning, the substrate power was ramped up to 1000 Watts, which corresponds to a bias of about −110 volts. HMDSO was introduced through the LDS. A precursor flow rate of 0.32 g/min was used. Argon was used as the carrier gas to assist in transport of precursor through the LDS and into the deposition chamber. The argon flow rate was 50 sccm. After introduction of the precursor, the power was held constant at 1000 W for 30 seconds to allow the pressure to stabilize and RF power to be minimized via an automatic matching network. Then the RF power was switched to pulse mode. The pulse frequency was 0.5 Hz, and the duty cycle was 50%. The power was pulsed between 1000 W and 0 Watts. The deposition was performed under the above conditions for 10 minutes. This resulted in a 0.89 $\mu$m thick, highly adherent coating. The coating exhibited a hardness of 0.12 GPa and an elastic modulus of 3.3 GPa on silicon substrates as measured by nanoindentation using the Nanoindenter IIs (Nano Industries, Oak Ridge, Tenn.). For the capacitance measurements, aluminum metal was deposited on top of the dielectric coating. A shadow mask was used to deposit 2 mm, 3 mm, 5 mm and 7 mm diameter aluminum dots to serve as the upper electrode for the capacitance measurements. The capacitance of the coating, measured at 1 MHz, ranged from 80 pF to 1050 pF depending on the diameter of the electrode. This correlates to a film with dielectric constant of 2.65 with a standard deviation of $\mp 0.08$.

EXAMPLE 6

Two full 100 mm silicon wafers, sputtered with about 1000 Å of titanium metal, were mounted on the bottom (powered) electrode, the upper electrode was grounded. The electrode separation distance was 7.7 cm. A portion of the titanium coated silicon substrate was shadow masked to allow electrical contact (to the lower titanium metal) for capacitance measurements. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 300 mTorr. An RF power (13.56 MHz) of 300 Watts was used to bias the substrates for an in-situ plasma cleaning. The substrates were plasma cleaned for about 5 minutes. After cleaning, the substrate power was ramped down to 100 Watts, which corresponds to a bias of about −37 volts. HMDSO was introduced through the LDS. A precursor flow rate of 0.06 g/min was used. Argon was used as the carrier gas to assist in transport of precursor through the LDS and into the deposition chamber. The argon flow rate was 50 sccm. The RF power was held constant at 100 W throughout the deposition. The deposition was performed under the above conditions for 50 minutes. This resulted in a 1.6 $\mu$m thick, highly adherent coating. The coating exhibited a hardness of 0.2 GPa and an elastic modulus of 2.6 GPa on silicon substrates as measured by nanoindentation using the Nanoindenter IIs (Nano Instruments, Oak Ridge, Tenn.). For the capacitance measurements, aluminum metal was deposited on top of the dielectric coating. A shadow mask was used to deposit 2 mm, 3 mm, 5 mm and 7 mm diameter aluminum dots to serve as the upper electrode for the capacitance measurements. The capacitance of the coating, measured at 1 MHz, ranged from 45 pF to 580 pF depending on the diameter of the electrode. This correlates to a film with dielectric constant of 2.82 with a standard deviation of $\mp 0.03$.

EXAMPLE 7

A coated silicon substrate coated under the conditions of Example 4 was annealed at atmospheric pressure in a nitrogen environment for 4 hours at 400° C. After the sample was annealed, aluminum electrodes, ranging in diameter from 2 mm to 7 mm, were deposited on the sample. The capacitance, measured at 1 MHz, ranged from 48 pF to 580 pF, which corresponds to a coating with dielectric constant of 2.78 with a standard deviation of $\mp 0.02$. Thus, annealing this sample had essentially no affect on the dielectric constant of the coating. The thermal stability of this coating meets the requirements of an IMD material for IC manufacturing. The hardness of the annealed coating was 0.15 GPa and the elastic modulus was 2.5 GPa on silicon substrates as measured by nanoindentation using the Nanoindenter IIs (Nano Instruments, Oak Ridge, Tenn.). A comparison of the FTIR spectra of this annealed sample to the 'as deposited' sample described in Example 1, showed no change in the intensity of the $SiCH_3$ absorption peak at wavenumber 1260.

EXAMPLE 8

Two full 100 mm silicon wafers, sputtered with about 1000 Å of titanium metal, were mounted on the bottom (powered) electrode, the upper electrode was grounded. The electrode separation distance was 7.7 cm. A portion of the titanium coated silicon substrate was shadow masked to allow electrical contact (to the lower titanium metal) for capacitance measurements. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 490 mTorr. An RF power (13.56 MHz) of 300 Watts was used to bias the substrates for an in-situ plasma cleaning. The substrates were plasma cleaned for about 5 minutes. After cleaning, the substrate power was ramped up to 385 Watts, which corresponds to a bias of about 125 volts. The RF power was held constant throughout the deposition. HMDSO was introduced through the LDS. A precursor flow rate of 0.06 g/min was used. Argon was used as the carrier gas to assist in transport of precursor through the LDS and into the deposition chamber. The argon flow rate was 100 sccm. The deposition was performed under the above conditions for 35 minutes. This resulted in a 0.75 $\mu$m thick, highly adherent coating. The coating exhibited a hardness of 7.5 GPa and an elastic modulus of 62.3 GPa on silicon substrates as measured by nanoindentation using the Nanoindenter IIs (Nano Instruments, Oak Ridge, Tenn.). For the capacitance measurements, aluminum metal was deposited on top of the dielectric coating. A shadow mask was used to deposit 2 mm, 3 mm, 5 mm and 7 mm diameter aluminum dots to serve as the upper electrode for the capacitance measurements. The capacitance of the coating, measured at 1 MHz, ranged from 135 pF to 1650 pF depending on the diameter of the electrode. This correlates to a film with dielectric constant of 3.8 with a standard deviation of $\mp 0.20$.

EXAMPLE 9

Two full 100 mm silicon wafers, sputtered with about 1000 Å of titanium metal, were mounted on the bottom (powered) electrode, the upper electrode was grounded. The electrode separation distance was 7.7 cm. A portion of the titanium coated silicon substrate was shadow masked to allow electrical contact (to the lower titanium metal) for capacitance measurements. Control samples of silicon, glass, and carbon steel were cleaned in a detergent, followed by isopropanol and then blow dried with nitrogen gas were also mounted on the substrate holder. The chamber was evacuated to an ultimate pressure of 15 mTorr. Argon was introduced into the chamber and the throttle valve was adjusted to raise the pressure up to 400 mTorr. An RF power (13.56 MHz) of 300 Watts was used to bias the substrates for an in-situ plasma cleaning. The substrates were plasma cleaned for about 5 minutes. After cleaning, the substrate power was ramped up to 500 Watts and held constant, which corresponds to a bias of about 30 volts. HMDSO was introduced through the LDS. A precursor flow rate of 0.28 g/min was used. Argon was used as the carrier gas to assist in transport of precursor through the LDS and into the deposition chamber. The argon flow rate was 50 sccm. The deposition was performed under the above conditions for 30 minutes (low dielectric constant layer). The pressure was then slowly ramped up to 500 mTorr and the RF power was slowly ramped down to 385 W over a period of 15 minutes (transition layer). The deposition was continued at 385 W for 10 minutes (etch stop layer). This resulted in a total thickness of 1.45 microns. The low dielectric constant layer was 1.0 μm thick, with a dielectric constant of 2.53, as in Example 3. The transition layer was 0.45 microns thick, with dielectric constant ranging from 2.5 at the low-k side to 3.8 at the etch stop side. The hardness of the transition layer changed from 0.05 GPa at the low dielectric constant side to 7.5 GPa at the etch stop side. The etch stop layer had a dielectric constant of 3.8, as in Example 8.

Variants of this example are also possible. Coatings with a dielectric constant gradient, coatings with different thicknesses of low dielectric constant layers, transition layers and the etch stop layers and higher dielectric constant etch stop coatings, including DLC, DLN and $Si_3N_4$ could be produced.

EXAMPLE 10

Two full 100 mm silicon wafers, sputtered with about 1000 Å of titanium metal, were mounted on the bottom (powered) electrode, the upper electrode was grounded. The electrode separation distance was 7.7 cm. A portion of the titanium coated silicon substrate was shadow masked to allow electrical contact (to the lower titanium metal) for capacitance measurements. Control samples of silicon, glass, and carbon steel were cleaned in a detergent, followed by isopropanol, blow dried with nitrogen gas and mounted on the substrate holder. The chamber was evacuated to an ultimate pressure of 15 mTorr. Argon was introduced into the chamber and the throttle valve was adjusted to raise the pressure up to 400 mTorr. An RF power (13.56 MHz) of 300 Watts was used to bias the substrates for an in-situ plasma cleaning. The substrates were plasma cleaned for about 5 minutes. After cleaning, the substrate power was ramped up to 500 Watts and held constant, which corresponds to a bias of about 30 volts. HMDSO was introduced through LDS. A precursor flow rate of 0.28 g/min was used. Argon was used as the carrier gas to assist in transport of precursor through the LDS and into the deposition chamber. The argon flow rate was 50 sccm. The deposition was performed under the above conditions for 30 minutes (low dielectric constant layer). The pressure was then slowly ramped down to 100 mTorr and the RF power was slowly ramped to 600 W over a period of 15 minutes (transition layer). This resulted in a total thickness of 1.4 microns. The low dielectric constant layer was 1.0 μm thick, with a dielectric constant of 2.4, as in Example 1. The transition layer was 0.36 microns thick, with a dielectric constant ranging from 2.4 at the low dielectric constant side to 4.0 at the top surface. The hardness of the transition layer changed from 0.05 GPa at the low dielectric constant side to 8 GPa at the top surface. A seed layer of PVD copper (~1000 Å) was then deposited directly on the transition layer. The transition layer acts as a good barrier for copper diffusion, obviating the need for a copper barrier layer. This is important for 70 nm generation devices, which require near zero (or negligible) copper barrier thickness.

Variants of this example are also possible. Coatings with a dielectric constant gradient, coatings with different thicknesses of low dielectric constant and transition layers could be produced. The transition layer can be about 0.001 to about 0.1 micron thick and is a good barrier to copper. The transition layer could also be DLC, DLN, Ti-DLN, Ta-DLN, W-DLN, TiN, TaN and others materials known in the state of the art.

EXAMPLE 11

A piece of the coated silicon substrate from Example 4, which was annealed at atmospheric pressure in a nitrogen environment for 2 hours at 400° C. to yield a dielectric constant of 2.2, was coated with a thin layer of barrier material (50 to 500 Å). The barrier material was DLN, however, a barrier material of TiN, TaN, W, WN, DLC, DLN, or metal doped DLN could be substituted. On top of the barrier material a thin layer (~1000 Å) of copper was deposited by sputtering.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the claims which follow.

What is claimed is:

1. A material comprising carbon, oxygen, silicon and hydrogen having an upper surface and a lower surface and having a dielectric constant from about 2.1 to about 4.0, wherein the dielectric constant of the lower surface is from about 2.1 to about 2.7 and the dielectric constant of the upper surface is greater than 3.0.

2. A material according to claim 1, wherein a FTIR scan of the material includes at least two major peaks signifying Si—$CH_3$ bonding.

3. A material according to claim 2, wherein one of the at least two major peaks is at a wavenumber from about 835 to about 840.

4. A material according to claim 3, wherein one of the at least two major peaks is at wavenumber 836.

5. A material according to claim 2, wherein one of the at least two major peaks is at a wavenumber from about 1250 to about 1270.

6. A material according to claim 5, wherein one of the at least two major peaks is at wavenumber 1267.

7. A material according to claim 2, wherein the material comprises predominantly Si—CH$_3$ bonding.

8. A material according to claim 2, wherein the dielectric constant of the lower surface is from about 2.1 to about 2.8.

9. A material according to claim 8, wherein the dielectric constant of the lower surface is from about 2.1 to about 2.5.

10. A material according to claim 2, wherein the carbon is present in an amount from about 35 atomic percent to about 80 atomic percent of the material.

11. A material according to claim 10, wherein the carbon is present in an amount from about 40 atomic percent to about 60 atomic percent of the material.

12. A material according to claim 2, wherein the silicon is present in an amount from about 15 atomic percent to about 45 atomic percent of the material.

13. A material according to claim 12, wherein the silicon is present in an amount from about 20 atomic percent to about 35 atomic percent of the material.

14. A material according to claim 2, wherein the oxygen is present in an amount from about 10 atomic percent to about 45 atomic percent of the material.

15. A material according to claim 14, wherein the oxygen is present in an amount from about 15 atomic percent to about 25 atomic percent of the material.

16. A material according to claim 2, wherein the material has a hardness from about 0.05 to about 3.0 GPa.

17. A semiconductor comprising:
    a metal material and
    a dielectric material, wherein the dielectric material comprises the material of claim 1.

18. A semiconductor according to claim 17, wherein one of the at least two major peaks is at a wavenumber from about 835 to about 840.

19. A semiconductor according to claim 18, wherein one of the at least two major peaks is at a wavenumber from about 1265 to about 1270.

20. A semiconductor according to claim 19, wherein one of the at least two major peaks is at wavenumber 1267.

21. A semiconductor according to claim 20, wherein the material comprises predominantly Si—CH$_3$ bonding.

22. A semiconductor according to claim 18, wherein one of the at least two major peaks is at wavenumber 836.

* * * * *